(12) United States Patent
Hemink et al.

(10) Patent No.: US 8,189,378 B2
(45) Date of Patent: May 29, 2012

(54) REDUCING PROGRAM DISTURB IN NON-VOLATILE STORAGE

(75) Inventors: Gerrit Jan Hemink, Yokohama (JP); Shih-Chung Lee, Katsuradaiminami (JP)

(73) Assignee: SanDisk Technologies Inc., Plano, TX (US)

( * ) Notice: Subject to any disclaimer, the term of this patent is extended or adjusted under 35 U.S.C. 154(b) by 757 days.

(21) Appl. No.: 11/535,628

(22) Filed: Sep. 27, 2006

(65) Prior Publication Data
US 2008/0084747 A1    Apr. 10, 2008

(51) Int. Cl.
*G11C 16/04* (2006.01)
(52) U.S. Cl. ......... 365/185.02; 365/185.17; 365/185.18
(58) Field of Classification Search ............ 365/185.17, 365/185.18, 185.33
See application file for complete search history.

(56) References Cited

U.S. PATENT DOCUMENTS

| | | | |
|---|---|---|---|
| 5,043,940 A | 8/1991 | Harari | |
| 5,172,338 A | 12/1992 | Mehrotra | |
| 5,570,315 A | 10/1996 | Tanaka | |
| 5,621,684 A | 4/1997 | Jung | |
| 5,677,873 A | 10/1997 | Choi | |
| 5,715,194 A | 2/1998 | Hu | |
| 5,774,397 A | 6/1998 | Endoh | |
| 5,818,757 A | 10/1998 | So | |
| 5,867,429 A * | 2/1999 | Chen et al. ............ | 365/185.33 |
| 5,887,145 A | 3/1999 | Harari | |
| 5,973,962 A | 10/1999 | Kwon | |
| 5,991,202 A | 11/1999 | Derhacobian | |
| 6,011,287 A | 1/2000 | Itoh | |
| 6,046,935 A | 4/2000 | Takeuchi | |
| 6,049,494 A | 4/2000 | Sakui | |
| 6,061,270 A | 5/2000 | Choi | |
| 6,107,658 A | 8/2000 | Itoh | |
| 6,181,599 B1 | 1/2001 | Gongwer | |
| 6,456,528 B1 | 9/2002 | Chen | |
| 6,522,580 B2 | 2/2003 | Chen | |
| 6,525,964 B2 | 2/2003 | Tanaka | |
| 6,614,688 B2 | 9/2003 | Jeong | |
| 6,643,188 B2 | 11/2003 | Tanaka | |
| 6,657,891 B1 * | 12/2003 | Shibata et al. ............ | 365/185.03 |
| 6,859,394 B2 | 2/2005 | Matsunaga | |
| 6,859,395 B2 | 2/2005 | Matsunaga | |
| 6,859,397 B2 | 2/2005 | Lutze | |
| 7,009,881 B2 | 3/2006 | Noguchi | |

(Continued)

FOREIGN PATENT DOCUMENTS

DE    10164149    7/2002

(Continued)

OTHER PUBLICATIONS

S. Aritome et al, "Reliability Issues of Flash Memory Cells," Proceedings of the IEEE, New York, vol. 81, No. 5, May 1, 1993, pp. 776-788.

(Continued)

*Primary Examiner* — Huan Hoang
*Assistant Examiner* — Jay Radke
(74) *Attorney, Agent, or Firm* — Vierra Magen Marcus & DeNiro LLP

(57) ABSTRACT

A non-volatile semiconductor storage system is programmed in a manner that reduces program disturb by applying a higher boosting voltage on one or more word lines that are connected to non-volatile storage elements that may be partially programmed.

16 Claims, 14 Drawing Sheets

U.S. PATENT DOCUMENTS

| | | | |
|---|---|---|---|
| 7,161,833 | B2 | 1/2007 | Hemink |
| 7,170,793 | B2 | 1/2007 | Guterman |
| 2002/0110019 | A1 | 8/2002 | Satoh |
| 2002/0126532 | A1 | 9/2002 | Matsunaga |
| 2003/0002348 | A1* | 1/2003 | Chen et al. ............... 365/189.01 |
| 2003/0147278 | A1 | 8/2003 | Tanaka |
| 2004/0080980 | A1* | 4/2004 | Lee .......................... 365/185.17 |
| 2004/0105308 | A1 | 6/2004 | Matsunaga |
| 2004/0174748 | A1* | 9/2004 | Lutze et al. .............. 365/185.28 |
| 2005/0047210 | A1* | 3/2005 | Matsunaga et al. ...... 365/185.17 |
| 2005/0174852 | A1 | 8/2005 | Hemink |
| 2005/0226055 | A1 | 10/2005 | Guterman |
| 2005/0237829 | A1* | 10/2005 | Nakamura et al. ............ 365/199 |
| 2007/0133249 | A1* | 6/2007 | Roohparvar .................. 365/100 |
| 2008/0043527 | A1* | 2/2008 | Aritome ................... 365/185.03 |

FOREIGN PATENT DOCUMENTS

| | | |
|---|---|---|
| WO | 2005104135 | 11/2005 |
| WO | 2007078793 | 7/2007 |
| WO | 2007089370 | 8/2007 |

OTHER PUBLICATIONS

Jung, et al., "A 3.3V 128Mb Multi-Level NAND Flash Memory for Mass Storage Applications," ISSCC96, Session 2, Flash Memory, Paper TP 2.1, IEEE, pp. 32-33, slide supplement pp. 20-21, 346-347 (1996).

Jung, et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

A. Modelli et al., "Basic feasibility constraints for multilevel CHE-programmed flashmemories," IEE Trans. on Electron Devices, vol. 48, No. 9, Sep. 2001, pp. 2032-2042.

T. Nozaki, et al., "A 1-Mb EEPROM with MONOS Memory Cell for Semiconductor Disk Application," IEEE Journal of Solid-State Circuits, vol. 26, No. 4 Apr. 1991, pp. 497-501.

K.D. Suh, et al., "A 3.3V 32 Mb NAND Flash Memory with Incremental Step Pulse Programming Scheme," Journal of Solid-State Circuits, vol. 30, No. 11, Nov. 1995, pp. 1149-1155.

Aritome, "Reliability Issues of Flash Memory Cells," Proceedings of the IEEE, IEEE. New York, vol. 81, No. 5, May 1, 1993.

International Search Report, dated Apr. 21, 2008, PCT/US2007/078842.

Written Opinion of the International Searching Authority, dated Apr. 21, 2008, PCT/US2007/078842.

U.S. Appl. No. 11/313,023, filed Dec. 19, 2005, titled, Method for Programming Non-volatile Memory with Reduced Program Disturb Using Modified Pass Voltages, by Hemink.

U.S. Appl. No. 11/312,925, filed Dec. 19, 2005, titled, Apparatus for Programming Non-volatile Memory with Reduced Program Disturb Using Modified Pass Voltages, by Hemink.

U.S. Appl. No. 11/535,634, filed Sep. 27, 2006.

Office Action dated Apr. 1, 2009 in U.S. Appl. No. 11/535,634.

International Preliminary Report on Patentability dated Mar. 31, 2009 in PCT Application No. PCT/US2007/078842.

Written Opinion of the International Searching Authority dated Apr. 9, 2009 in PCT Application No. PCT/US2007/078842.

Response to Office Action filed Jul. 30, 2009 in U.S. Appl. No. 11/535,634.

Response to Office Action dated Feb. 22, 2010, U.S. Appl. No. 11/535,634, filed Sep. 27, 2006.

Final Office Action dated Nov. 20, 2009 in U.S. Appl. No. 11/535,634.

Response to Office Action dated Oct. 20, 2010, U.S. Appl. No. 11/535,634, filed Sep. 27, 2006.

Office Action dated May 11, 2010, U.S. Appl. No. 11/535,634, filed Sep. 27, 2006.

Office Action dated Jan. 12, 2011, U.S. Appl. No. 11/535,634, filed Sep. 27, 2006.

Response to Office Action dated Mar. 23, 2011, U.S. Appl. No. 11/535,634, filed Sep. 27, 2006.

* cited by examiner

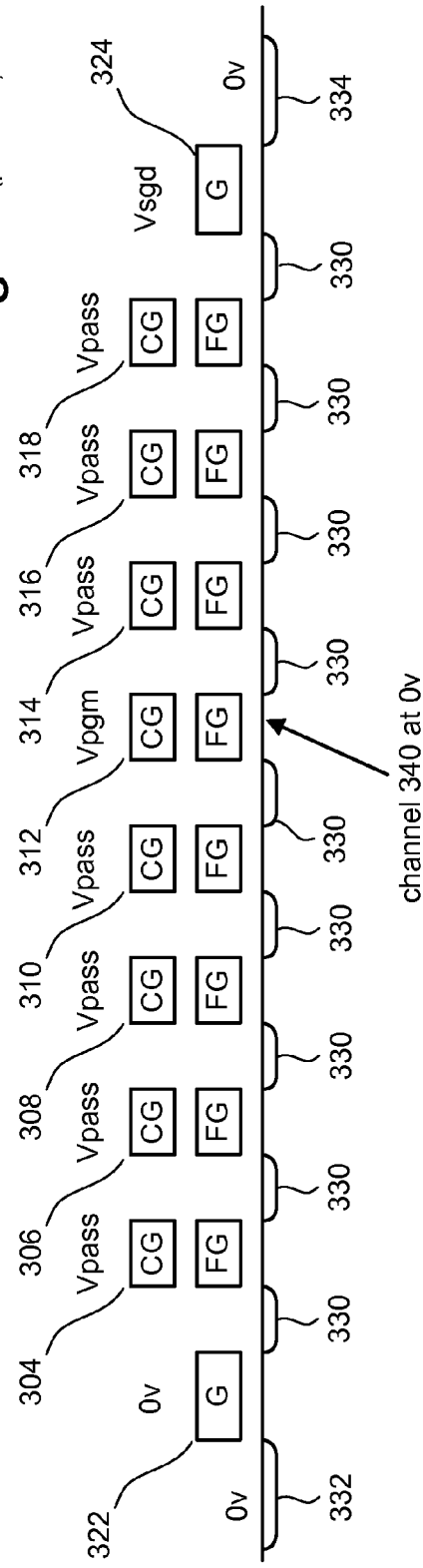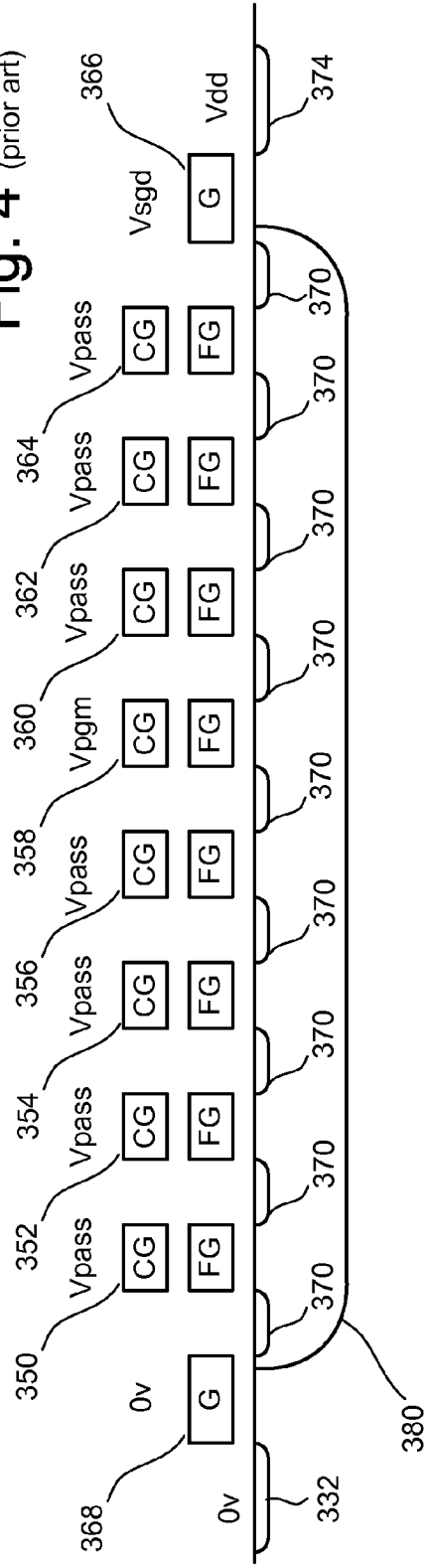

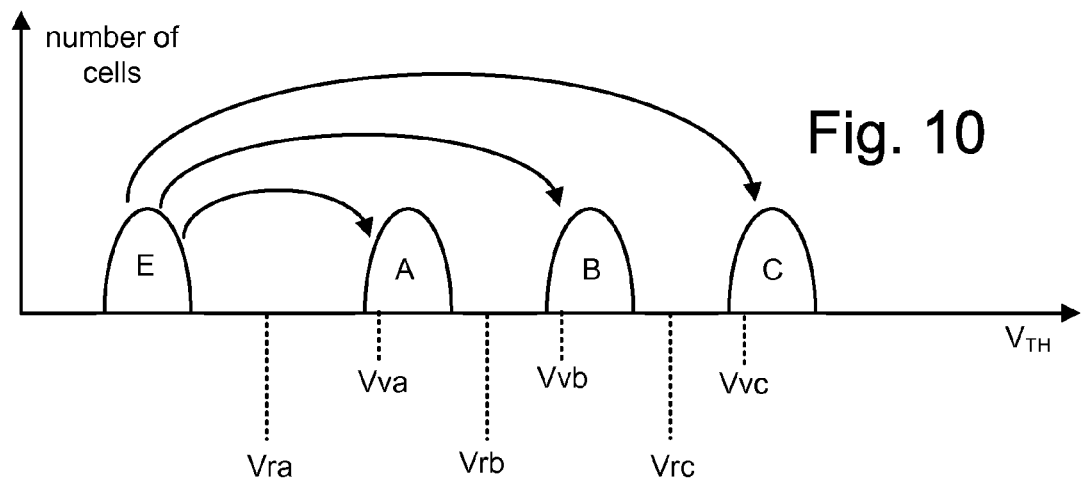
Fig. 10
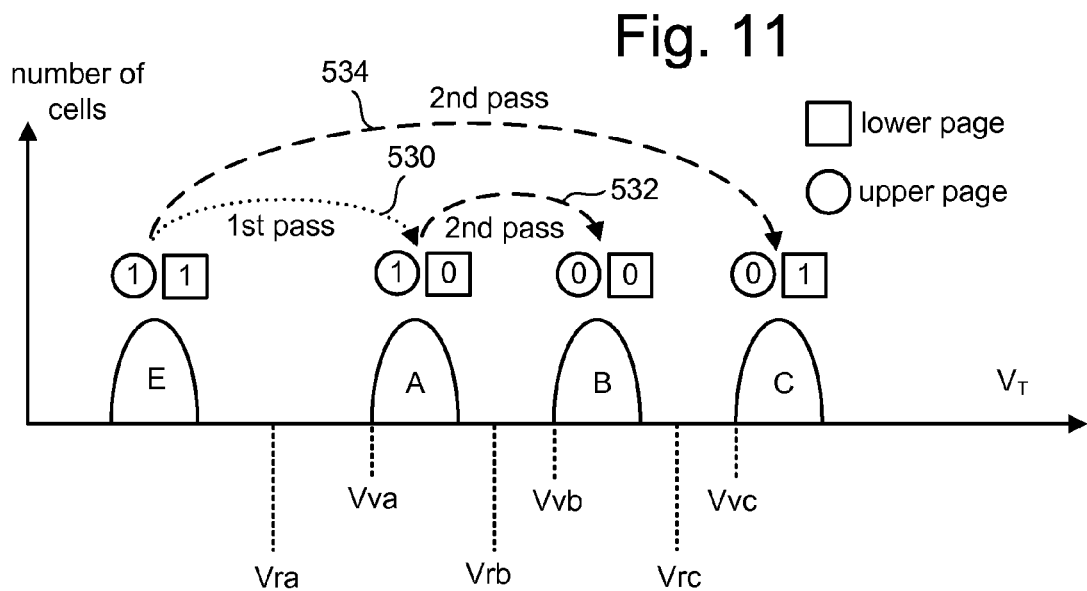
Fig. 11
| Wordline | Upper/ Lower Page | All Bit Lines |
|---|---|---|
| WL3 | upper | Page 7 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |
Fig. 13

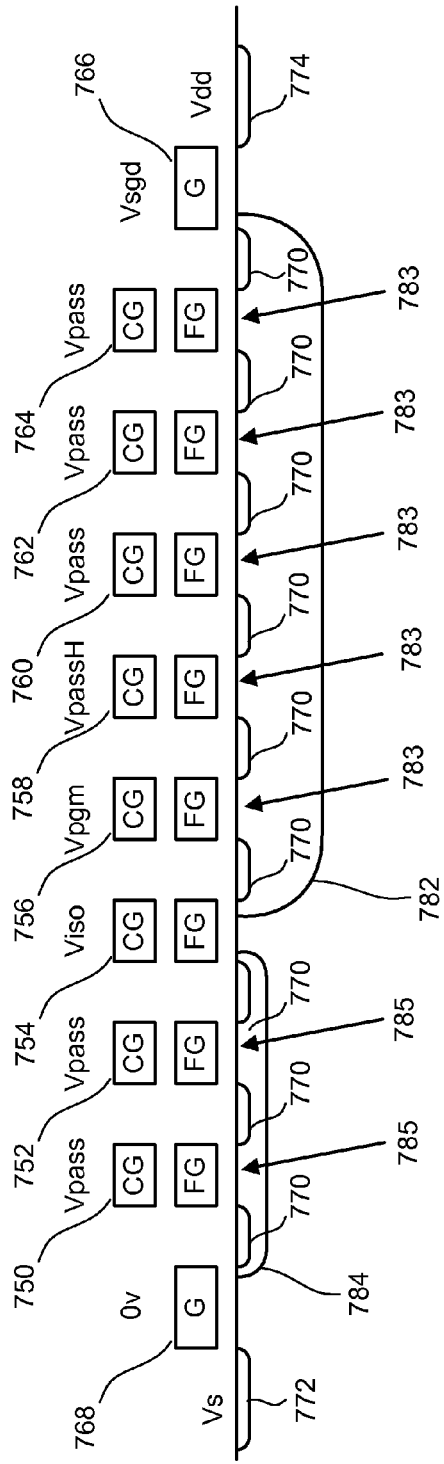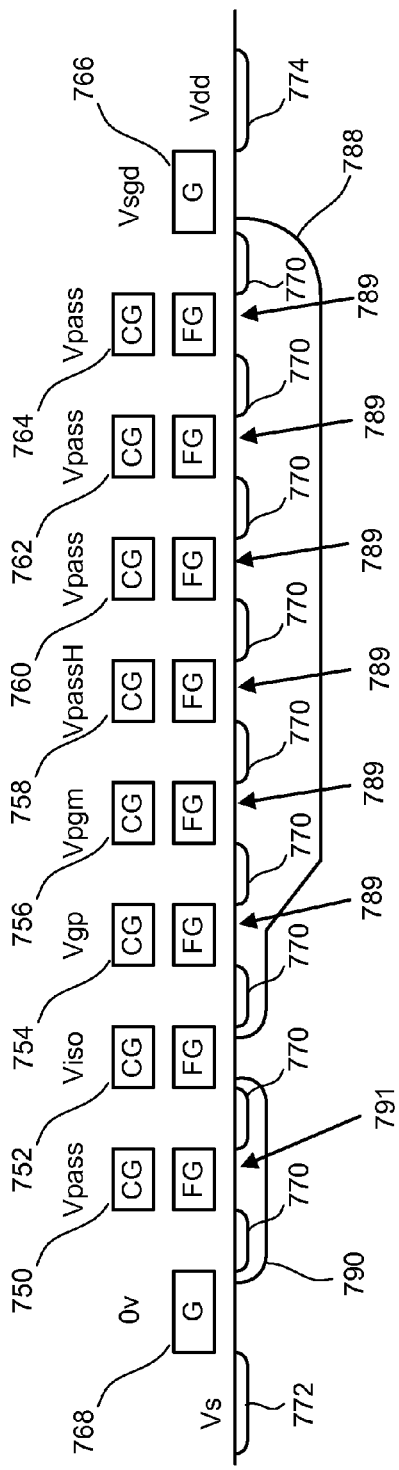

REDUCING PROGRAM DISTURB IN NON-VOLATILE STORAGE

CROSS-REFERENCE TO RELATED APPLICATIONS

The following application is cross-referenced and incorporated by reference herein in its entirety: U.S. patent application Ser. No. 11/535,634, entitled "Apparatus With Reduced Program Disturb In Non-Volatile Storage," by Gerrit Jan Hemink and Shih-Chung Lee, filed Sep. 27, 2006.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Many types of EEPROM and flash memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 shows four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, etc. The discussion herein is not limited to any particular number of memory cells in a NAND string.

A typical architecture for a flash memory system using a NAND structure will include several NAND strings. Each NAND string is connected to the source line by its source select gate controlled by a select line SGS and connected to its associated bit line by its drain select gate controlled by a select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers. The word lines (WL3, WL2, WL1 and WL0) comprise the rows of the memory array.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00."

Relevant examples of NAND type flash memories and their operation are provided in the following U.S. patents/patent applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348. The discussion herein can also apply to other types of flash memory in addition to NAND as well as other types of non-volatile memory.

When programming a flash memory cell, a program voltage is applied to the control gate and the bit line is grounded. Due to the voltage differential between the channel of the flash memory cell and the floating gate, electrons from the channel area under the floating gate are injected into the floating gate. When electrons accumulate in the floating gate, the floating gate becomes negatively charged and the threshold voltage of the memory cell is raised. To apply the program voltage to the control gate of the cell being programmed, that program voltage is applied on the appropriate word line. That word line is also connected to one memory cell in each of the other NAND strings that utilize the same word line. A problem arises when it's desired to program one cell on a word line without programming other cells connected to the same word line. Because the program voltage is applied to all memory cells connected to a word line, an unselected memory cell (a memory cell that is not to be programmed) on the same word line may become inadvertently programmed. The unintentional programming of the unselected memory cell on the selected word line is referred to as "program disturb."

Several techniques can be employed to prevent program disturb. In one method known as "self boosting," the unselected NAND strings are electrically isolated from the corresponding bit lines and a pass voltage (e.g. 7-10 volts, but not limited to this range) is applied to the unselected word lines during programming. The unselected word lines couple to the channel area of the unselected NAND strings, causing a voltage (e.g., 6-10 volts) to exist in the channel of the unselected NAND strings, thereby reducing program disturb. Self boosting causes a boosted voltage to exist in the channel which lowers the voltage differential across the tunnel oxide and hence reduces program disturb. Note that the boosted channel voltage can vary largely since the boosted channel voltage depends on the value of the pass voltage and also on the state of the memory cells, with boosting being most efficient (highest channel voltage) when all memory cells in the NAND string are in the erased state.

FIGS. 3 and 4 depict NAND strings that are being programmed and inhibited using the self-boosting method. FIG. 3 depicts a NAND string being programmed. The NAND string of FIG. 3 includes eight memory cells 304, 306, 308, 310, 312, 314, 316 and 318. Each of those eight memory cells includes a floating gate (FG) and a control gate (CG). Between each of the floating gates are source/drain regions 330. In some implementations, there is a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. The source/drain regions 330 are N+ diffusion regions that are formed in the P-well.

At one end of the NAND string is a drain side select gate 324. The drain select gate 324 connects the NAND string to the corresponding bit line via bit line contact 334. At another end of the NAND string is a source select gate 322. Source select gate 322 connects the NAND string to common source line 332. During programming, the memory cell selected for programming (e.g., memory cell 312) receives a program voltage Vpgm on its associated word line. The program voltage Vpgm can typically vary between 12 to 24 volts. In one embodiment, the program voltage signal is a set of pulses which increase in magnitude with each new pulse. A boosting voltage (also called a pass voltage) Vpass of approximately 8 volts is applied to the control gates of the memory cells that are not selected for programming. Source select gate 322 is in an isolating state, receiving 0 volts at its gate (G). A low voltage is applied to the common source line 332. This low voltage can be zero volts. However, the source voltage can also be slightly higher than zero volts to provide better isolation characteristics of the source side select gate. A voltage Vsgd, which is typically in the range of the power supply voltage Vdd (e.g., 2.5 volts), is applied to drain side select gate 324. Zero volts is applied to bit line contact 334 via the corresponding bit line to enable programming of the selected memory cell 312. Channel 340 is at or close to zero volts. Because of the voltage differential between the channel and the floating gate of memory cell 312, electrons tunnel through the gate oxide (also commonly referred to as tunnel oxide) into the floating gate by Fowler-Nordheim tunneling.

The NAND string of FIG. 4 depicts a NAND string being inhibited from programming. The NAND string includes eight memory cells 350, 352, 354, 356, 358, 360, 362 and 364. The NAND string also includes drain select gate 366 connecting the NAND string to the corresponding bit line via bit line contact 374, and source select gate for 368 connecting the NAND string to common source line 332. Between each of the floating gate stacks are source/drain regions 370. The NAND string of FIG. 4 has Vsgd applied to the gate of the drain select gate 366, zero volts applied to the gate of the source side select gate 368 and zero volts (or a slightly higher voltage) at the common source line 332. Bit line contact 374 receives the power supply voltage Vdd via the corresponding bit line in order to inhibit the programming of memory cell 358.

When Vdd is applied, the drain select transistor 366 will initially be in a conducting state; therefore, the channel area under the NAND string will partly be charged up to a higher potential (higher than zero volts and typically equal or almost equal to Vdd). This charging is commonly referred to as pre-charging. The pre-charging will stop automatically when the channel potential has reached Vdd or a lower potential given by Vsgd−Vt, where Vt equals the threshold voltage of the drain select gate 366. In general, during pre-charging, Vsgd is chosen in such a way that Vsgd−Vt>Vdd so that the channel area under the NAND string can be pre-charged to Vdd. After the channel has reached that potential, the select gate transistor is non-conducting or made non-conducting by lowering Vsgd to a value similar to Vdd (e.g. 2.5 volts). Subsequently, the voltages Vpass and Vpgm are ramped up from zero volts to their respective final values (not necessarily at the same time), and because the drain side select gate transistor 366 is in a non-conducting state, the channel potential will start to rise because of the capacitive coupling between the word lines and the channel area. This phenomenon is called self boosting. The channel area under the NAND string of FIG. 4 is boosted, more or less uniformly, to a boosting voltage. Because the voltage differential between the floating gate of memory cell 358 and the channel has been reduced, programming is inhibited. More information about programming NAND flash memory, including self boosting techniques, can be found in U.S. Pat. No. 6,859,397, "Source Side Self Boosting Technique for Non-Volatile Memory," Lutze at al., incorporated herein by reference in its entirety. Note that FIG. 4 shows region 380, which includes a channel area at the surface of the substrate and a depletion layer (an area with increased electrical field due to the channel that is boosted to a high voltage) under the boosted channel area. The channel area exists under each of the floating gate/control gate stacks and between the source/drain regions 370.

Another attempt to address program disturb is Erased Area Self Boosting ("EASB"). EASB attempts to isolate the channel of previously programmed cells from the channel of the memory cell being inhibited. In the EASB method, the channel area of the selected NAND string is divided into two areas: an area at the source side of the selected word line that can contain a number of programmed (or erased cells) memory cells and an area at the drain side of the selected word line in which the cells are still in the erased state, or at least not yet in the final programmed state. The two areas are separated by a word line that is biased to a low isolation voltage, typically zero volts. Because of this separation, the two areas can be boosted to different potentials. In almost all cases, the area at the drain side of the selected word line will be boosted to a higher potential than the area at the source side. Since the highest boosted area is the area with the erased cells, this boosting method is referred to as Erased Area Self Boosting.

Another boosting scheme, known as Revised Erased Area Self Boosting (REASB) is similar to EASB, except that between the word line receiving the isolation voltage and the selected word line is a word line receiving an intermediate voltage (between the Vpass and the isolation voltage).

Although the above boosting methods have reduced program disturb, they have not eliminated the problem. As scaling of memory devices becomes more aggressive, the effects of program disturb become greater. Additionally, multi-state flash memory devices that require tight threshold voltage distribution may experience widening of those distributions. In particular, the word lines next to the select gates (especially next to the source select gate) are more likely to be subjected to program disturb.

One effect that can occur to the memory cell next to the source select gate (e.g., memory cell 350 is next to source select gate 368 of FIG. 4) is Gate Induced Drain Leakage (GIDL), which is also referred to as Band-To-Band-Tunneling. GIDL causes the generation of electrons at the source select gate when the channel under the NAND string is inhibited from programming (boosted to a high voltage). Subsequently, the generated electrons are accelerated in the strong lateral electric field towards the floating gate of the memory cell next to the source select gate. Some of the electrons can gain sufficient energy to be injected into the tunnel oxide under the floating gate or in the floating gate itself and, thus modify the threshold voltage of the corresponding memory cell.

FIG. 5 shows a portion of the NAND string of FIG. 4, with a zooming-in on the drain of the source select gate and a portion of the channel for memory cell 350. Due to boosting of the NAND string during a program inhibit operation (for example when other NAND strings are being programmed), a high voltage is present in the channel area of the boosted NAND string. This high voltage is also present at the junction area between source select gate 368, which is typically biased at 0V, and memory cell 350 next to source select gate 368. This bias condition may cause the creation of electron-hole pairs, also known as GIDL. The holes will go to P-well area 384. The electrons will move to the boosted channel area. In general, there is a lateral electric field present in the junction area between the source select gate and the memory cell next to the source side select gate because part of that junction (drain/source) is depleted due to the large voltage difference between channel area under the memory cells and the channel area under the select gate. The electrons can be accelerated in the electric field and may gain enough energy to be injected in the tunnel oxide of the memory cell next to the source side select gate or may even reach the floating gate of that memory cell. In both cases, the threshold voltage of the corresponding memory cell will change due to the presence of the injected electrons, thereby, risking an error when reading the memory cell next to the source select gate.

To reduce the effects of GIDL, the boosting voltage Vpass can be lowered to reduce the amount of channel boosting during the inhibit operation. However, this may result in program disturb due to insufficient boosting (as described above). Thus, choosing the appropriate value for Vpass is very important.

SUMMARY OF THE INVENTION

Technology is described herein for reducing program disturb that includes applying different boosting voltages to the unselected memory cells.

One embodiment includes boosting a group of unselected non-volatile storage elements (or at least a portion of the group of unselected non-volatile storage elements) and applying a program signal to a particular non-volatile storage element while the group of unselected non-volatile storage elements is boosted. The group of unselected non-volatile storage elements that are boosted includes the particular non-volatile storage element, a set of non-volatile storage elements that have not completed full programming since a last erase process for the group, and other non-volatile storage elements. The boosting includes applying one or more higher boosting signals to the set of non-volatile storage elements and one or more different boosting signals to the other non-volatile storage elements, where the one or more higher boosting signals are greater than the one or more different boosting signals.

Another embodiment includes applying boosting signals to a group of unselected non-volatile storage elements during a programming operation and applying a program signal to a targeted unselected non-volatile storage element during the programming operation such that the targeted unselected non-volatile storage element does not program due to the boosting signals. The group of unselected non-volatile storage elements are on a common side of the targeted unselected non-volatile storage element. A neighbor non-volatile storage element of the group is next to the targeted unselected non-volatile storage element. The targeted unselected non-volatile storage element and the group of unselected non-volatile storage elements are all in series with each other. The application of boosting signals to the group includes applying a particular boosting signal to the neighbor non-volatile storage element and applying a different boosting signal to other non-volatile storage elements of the group. The particular boosting signal is higher than the different boosting signal. The other non-volatile storage elements of the group have not been subjected to programming since a last erase of the group.

Another embodiment includes subjecting non-volatile storage elements connected to a first word line to partial programming and subjecting non-volatile storage elements connected to a second word line to partial programming. The first word line is next to the second word line and both word lines are within a group of word lines associated with a group of non-volatile storage elements that includes the non-volatile storage elements connected to the first word line and the non-volatile storage elements connected to the second word line. Programming is completed for the non-volatile storage elements connected to the first word line including applying a programming signal to the first word line, applying a first pass signal to the second word line and applying one or more other pass signals to other word lines of the group of word lines. The completing of the programming for the non-volatile storage elements connected to the first word line is performed after subjecting the non-volatile storage elements connected to the second word line to partial programming.

Another embodiment includes applying a program signal to a selected word line for a group of non-volatile storage elements, applying a first pass signal to a set of unselected word lines for the group of non-volatile storage elements, and applying a higher pass signal than the first pass signal to a neighboring word line (with respect to the selected word line) that is next for completion of programming for its connected non-volatile storage elements of the group of non-volatile storage elements.

Some example implementations comprise a plurality of non-volatile storage elements, a set of control lines (e.g., word lines, bit lines or other control lines) in communication with the non-volatile storage elements, and a managing circuit, including one or more voltage providing circuits in communication with the control lines to provide signals to the set of non-volatile storage elements, for performing the processes discussed herein.

BRIEF DESCRIPTION OF THE DRAWINGS

FIG. 3 depicts a NAND string and a set of voltages applied to the NAND string during a programming operation.

FIG. 4 depicts a NAND string and a set of voltages applied to the NAND string during a programming operation.

FIG. 10 depicts an example set of threshold voltage distributions and describe a process for programming non-volatile memory.

FIG. 11 depicts an example set of threshold voltage distributions and describe a process for programming non-volatile memory.

FIG. 13 is a table depicting the order of programming non-volatile memory in one embodiment.

FIG. 18 depicts a NAND string and a set of voltages applied to the NAND string during a programming operation.

FIG. 19 depicts a NAND string and a set of voltages applied to the NAND string during a programming operation.

DETAILED DESCRIPTION

One example of a memory system suitable for implementing the present invention uses the NAND flash memory structure. However, other types of non-volatile storage devices can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 1:
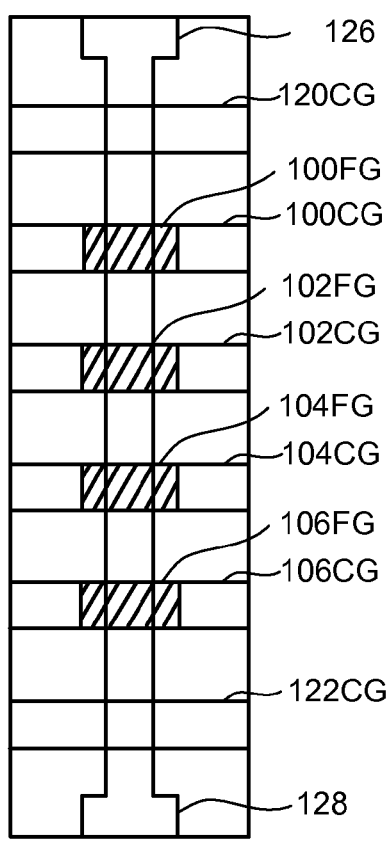
FIG. 1 is a top view of a NAND string.
Figure 2:
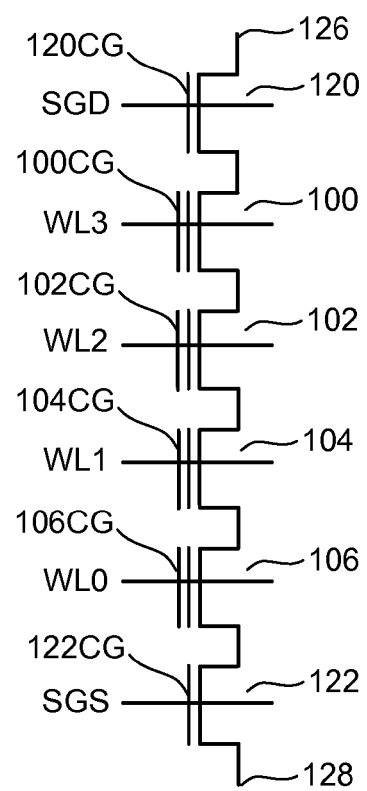
FIG. 2 is an equivalent circuit diagram of the NAND string.
Figure 5:
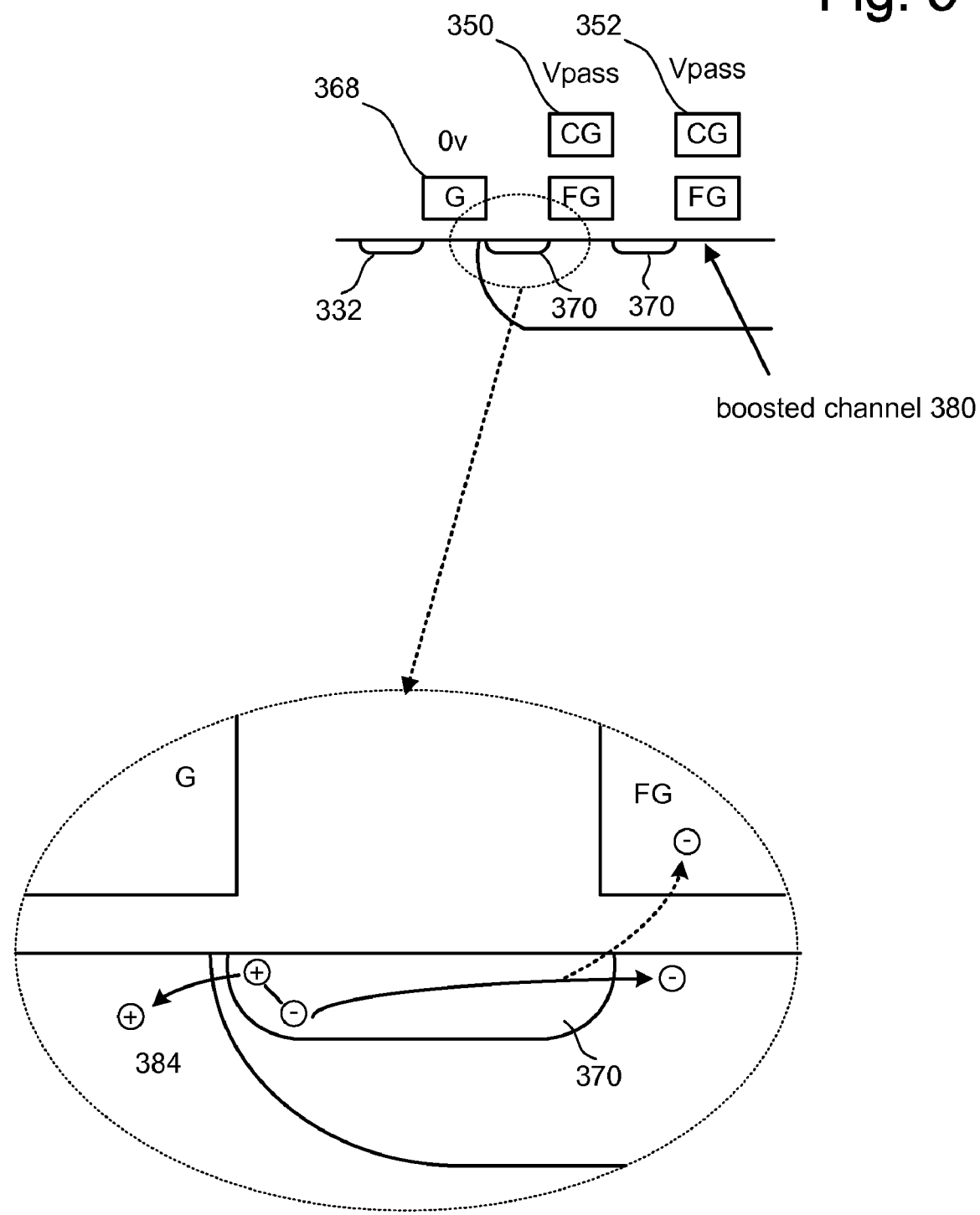
FIG. 5 depicts a portion of a NAND string.
Figure 6:
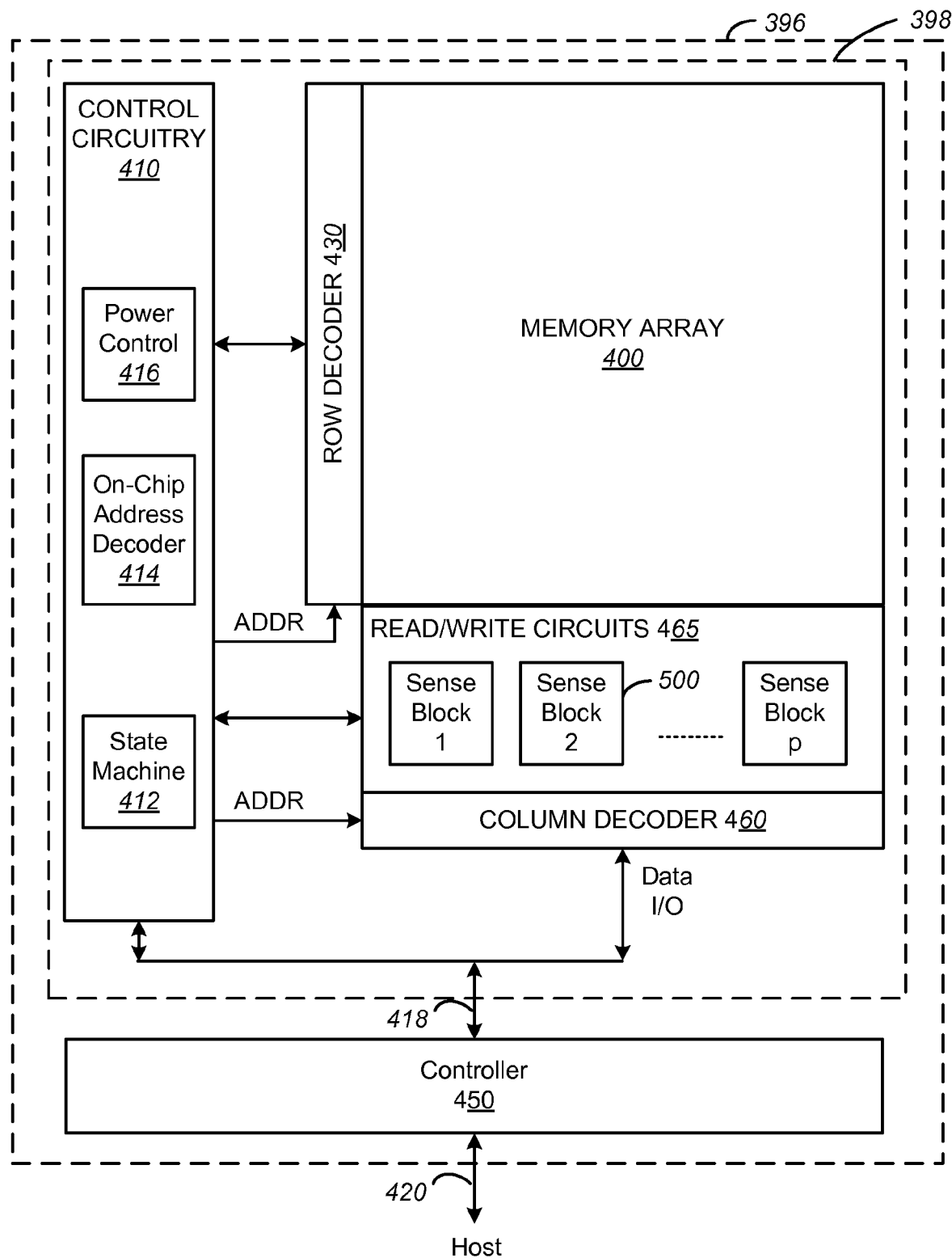
FIG. 6 is a block diagram of a non-volatile memory system.

FIG. 6 illustrates a memory device 396 having read/write circuits for reading and programming a page of memory cells in parallel, according to one embodiment. Memory device 396 may include one or more memory die 398. Memory die 398 includes a two-dimensional array of memory cells 400, control circuitry 410, and read/write circuits 465. In some embodiments, the array of memory cells can be three dimensional. Memory array 400 is addressable by word lines via row decoder 430 and by bit lines via column decoder 460. Read/write circuits 465 include multiple sense blocks 500 and allow a page of memory cells to be read or programmed in parallel. A controller 450 can be included in the same memory device 396 (e.g., a removable storage card) as the one or more memory die 398. Commands and Data are transferred between the host and controller 450 via lines 420 and between the controller and the one or more memory die 398 via lines 418.

Control circuitry 410 cooperates with the read/write circuits 465 to perform memory operations on the memory array 400. Control circuitry 410 includes a state machine 412, an on-chip address decoder 414 and a power control module 416. State machine 412 provides chip-level control of memory operations. On-chip address decoder 414 provides an address interface between that used by the host or a memory controller to the hardware address used by the decoders 430 and 460. Power control module 416 controls the power and voltages supplied to the word lines and bit lines during memory operations. In one embodiment, power control module includes one or more voltage providing circuits that can receive a base voltage (e.g., Vdd power supply or other voltage) and generate any of the voltages described herein. One example of a voltage providing circuit is a charge pump.

In some implementations, some of the components of FIG. 6 can be combined. In various designs, one or more of the components of FIG. 6 (alone or in combination), other than memory cell array 400, can be thought of as a managing circuit. For example, a managing circuit may include any one of or a combination of control circuitry 410, state machine 412, decoders 414/460, power control 416, sense blocks 500, read/write circuits 465, controller 450, etc.

Figure 7:
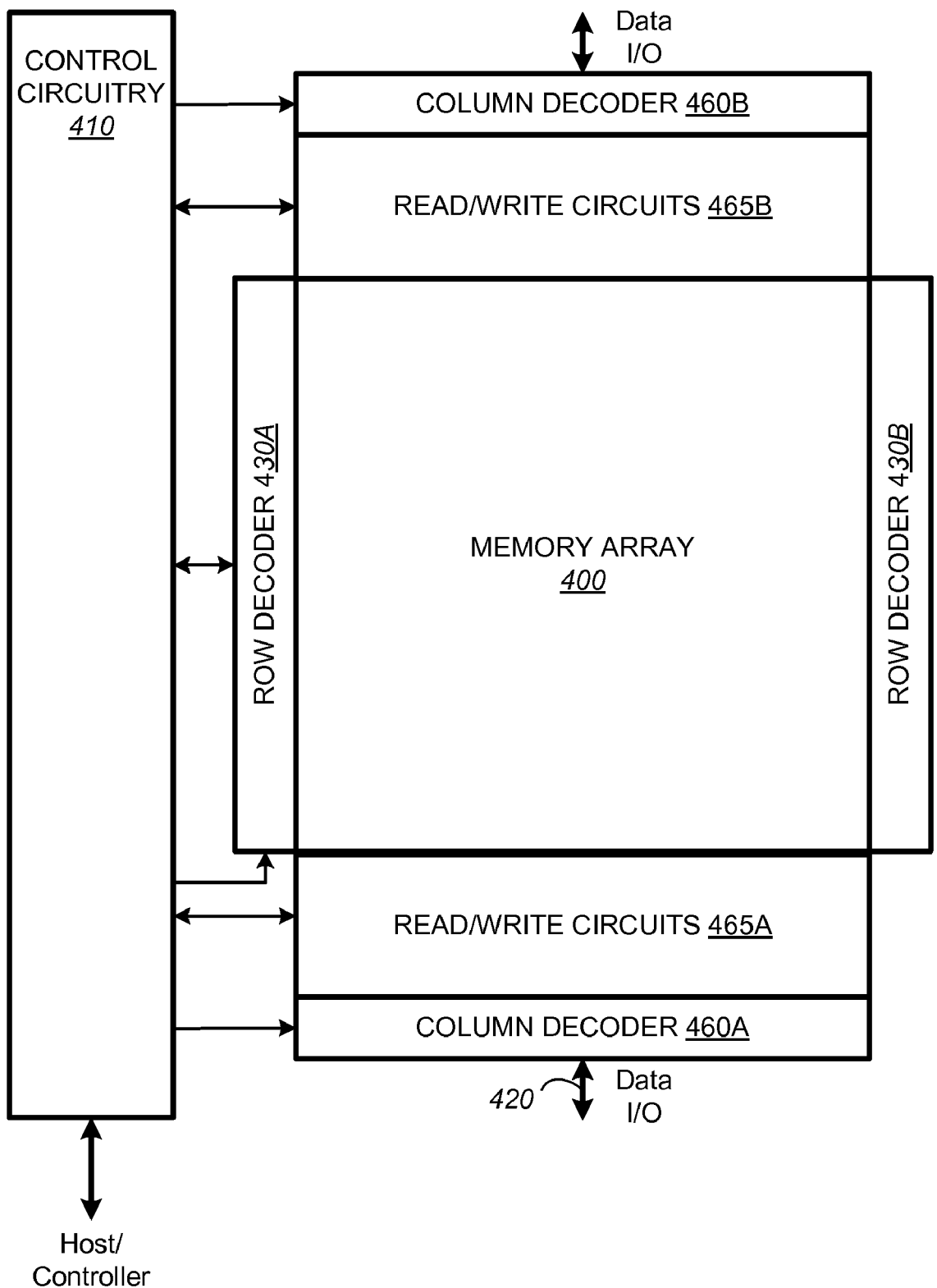
FIG. 7 is a block diagram of a non-volatile memory system.

FIG. 7 illustrates another arrangement of the memory device 396 shown in FIG. 6. Access to the memory array 400 by the various peripheral circuits is implemented in a symmetric fashion, on opposite sides of the array, so that the densities of access lines and circuitry on each side are reduced by half. Thus, the row decoder is split into row decoders 430A and 430B and the column decoder into column decoders 460A and 460B. Similarly, the read/write circuits are split into read/write circuits 465A connecting to bit lines from the bottom and read/write circuits 465B connecting to bit lines from the top of the array 400. In this way, the density of the read/write modules is essentially reduced by one half. The device of FIG. 7 can also include a controller, as described above for the device of FIG. 6.

Figure 8:
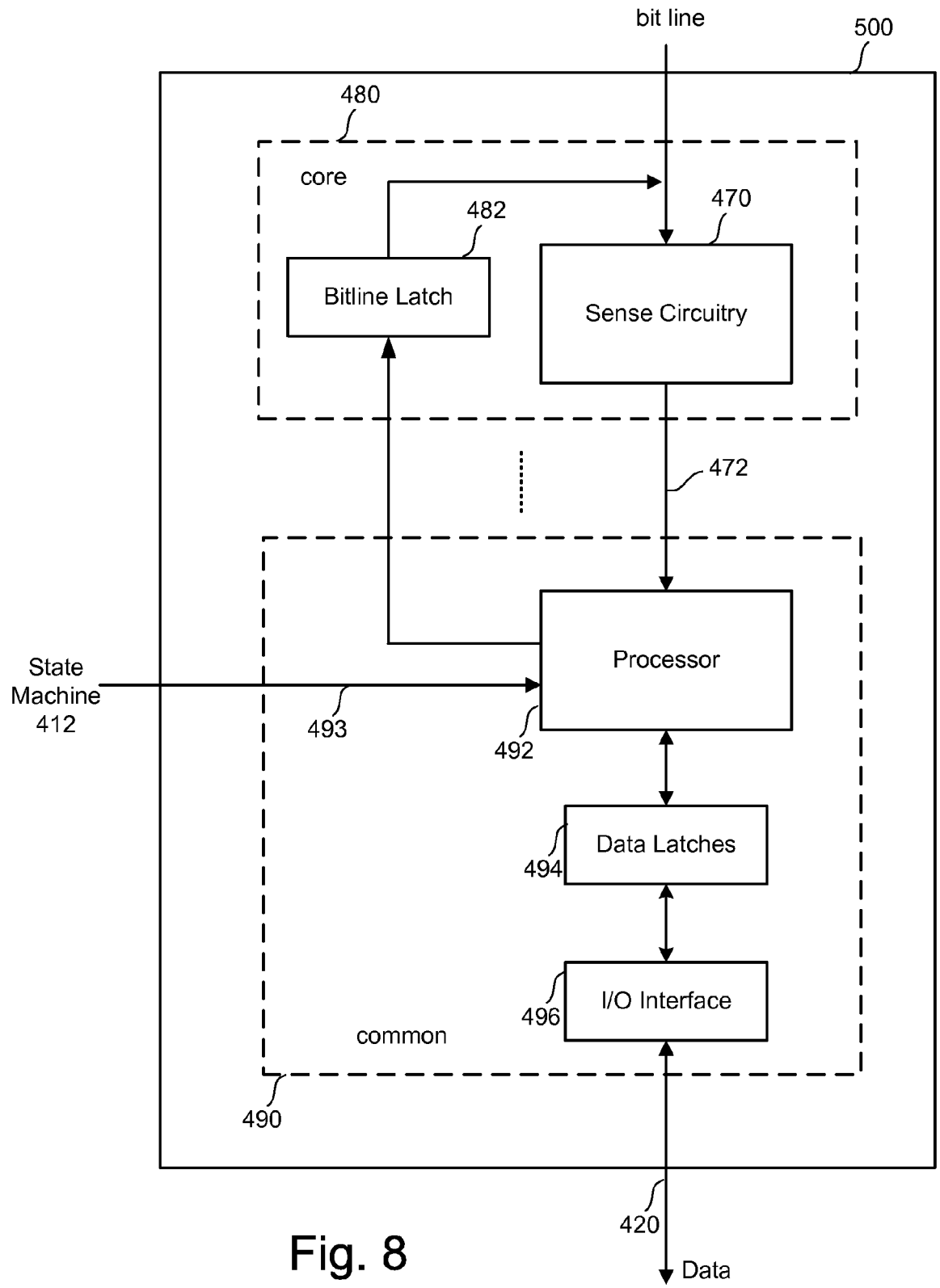
FIG. 8 is a block diagram depicting one embodiment of the sense block.

FIG. 8 is a block diagram of an individual sense block 500 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. patent application Ser. No. 11/026,536 "Non-Volatile Memory & Method with Shared Processing for an Aggregate of Sense Amplifiers" filed on Dec. 29, 2004, which is incorporated herein by reference in its entirety.

Sense module 480 comprises sense circuitry 470 that determines whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 412 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 8) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine needs to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if programming pulses appear on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three data latches per sense module 480. In some implementations (but not required), the data latches are implemented as a shift register so that the parallel data stored therein is converted to serial data for data bus 420, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. patent application Ser. No. 11/015,199 titled "Improved Memory Sensing Circuit And Method For Low Voltage Operation," Inventor Raul-Adrian Cernea, filed on Dec. 16, 2004; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 9:
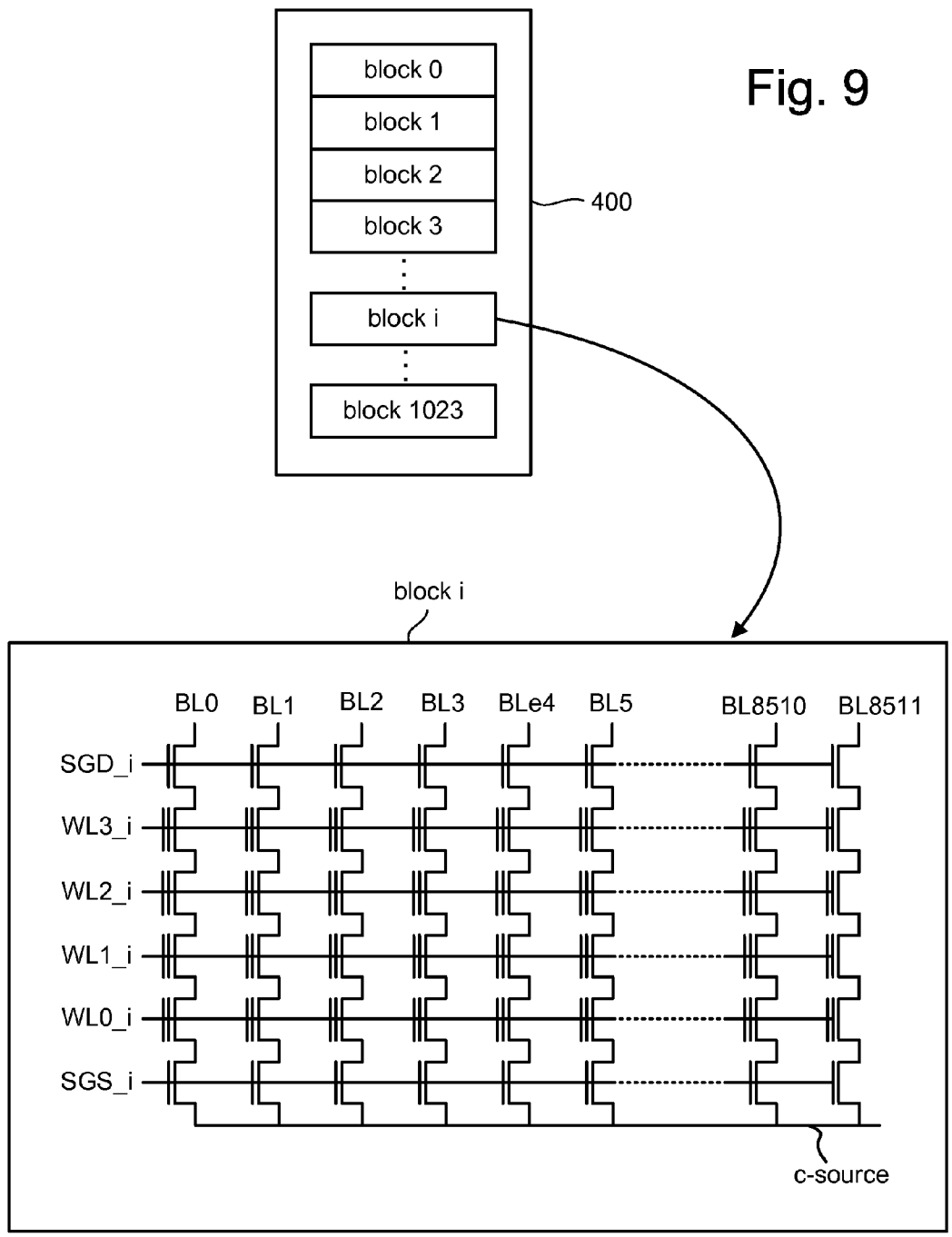
FIG. 9 is a block diagram depicting one embodiment of a memory array.

FIG. 9 depicts an exemplary structure of memory cell array 400 is described. In one embodiment, the array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. In one embodiment, the individual pages may be divided into segments and the segments may contain the fewest number of cells that are written at one time as a basic programming operation. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. Overhead data is typically an additional 16-20 bytes. A large number of pages form a block, anywhere from 8 pages, for example, up to 32, 64, 128 or more pages.

As one example, a NAND flash EEPROM is depicted in FIG. 9 that is partitioned into 1,024 blocks. In each block, in this example, there are 8,512 columns corresponding to bit lines BL0, BL1, . . . BL8511. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 9 shows four memory cells connected in series to form a NAND string. Although four cells are shown to be included in each NAND string, more or less than four can be used (e.g., 16, 32, 64 or another number or memory cells can be on a NAND string). One terminal of the NAND string is connected to a corresponding bit line via a drain select gate (connected to select gate drain line SGD), and another terminal is connected to c-source via a source select gate (connected to select gate source line SGS).

At the end of a successful programming process (with verification), the threshold voltages of the memory cells should be within one or more distributions of threshold voltages for programmed memory cells or within a distribution of threshold voltages for erased memory cells, as appropriate. FIG. 10 illustrates example threshold voltage distributions for the memory cell array when each memory cell stores two bits of data. Other embodiment, however, may use more or less than two bits of data per memory cell. FIG. 10 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Each distinct threshold voltage range of FIG. 10 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present invention can also be used with other multi-state structures including those that include more or less than four states.

FIG. 10 also shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 10 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C. Full sequence programming is graphically depicted by the three curved arrows of FIG. 10.

FIG. 11 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 534. If the cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page.

In one embodiment, a system can be set up to perform full sequence writing if enough data is written to fill up a word line. If not enough data is written, then the programming process can program the lower page with the data received.

When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. patent application titled "Pipelined Programming of Non-Volatile Memories Using Early Data," Pub. No. 2006/0126390, Ser. No. 11/013,125, filed on Dec. 14, 2004, inventors Sergy Anatolievich Gorobets and Yan Li, incorporated herein by reference in its entirety.

Figure 12A:
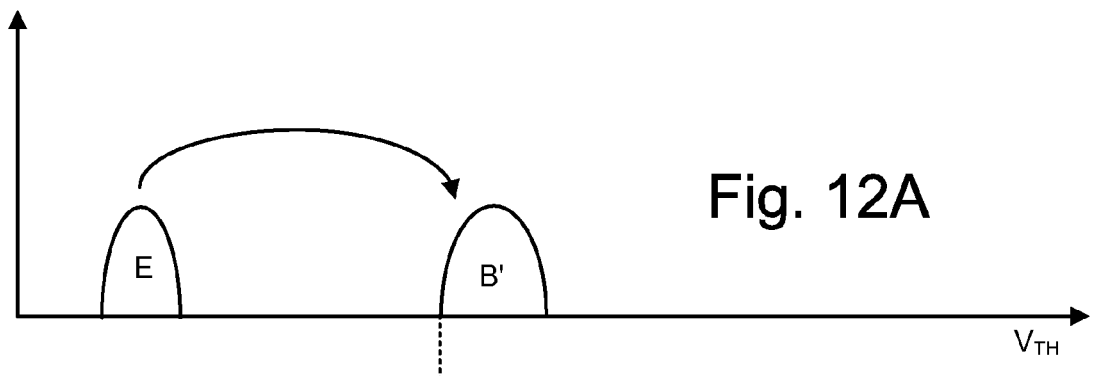
FIGS. 12A-C show various threshold voltage distributions and describe a process for programming non-volatile memory.
Figure 12B:
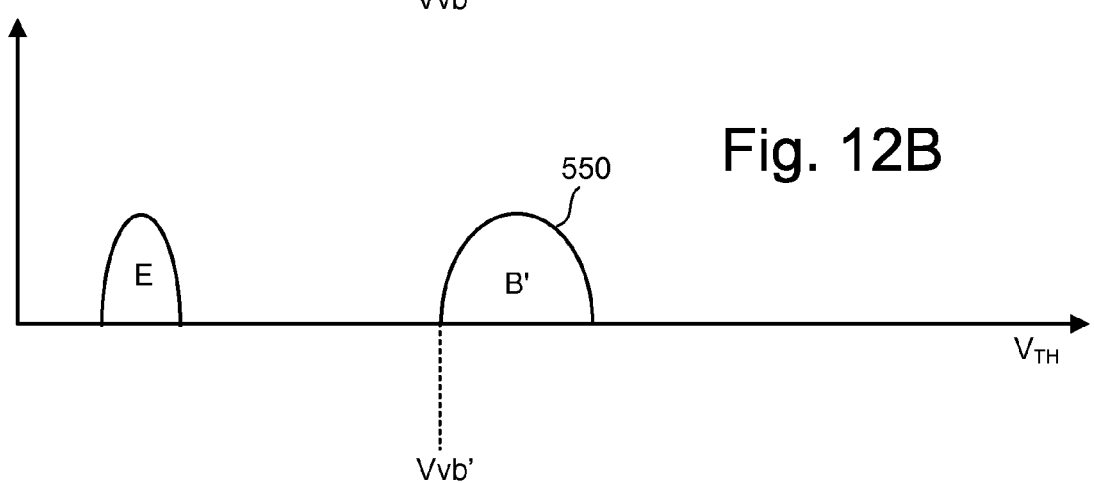
Figure 12C:
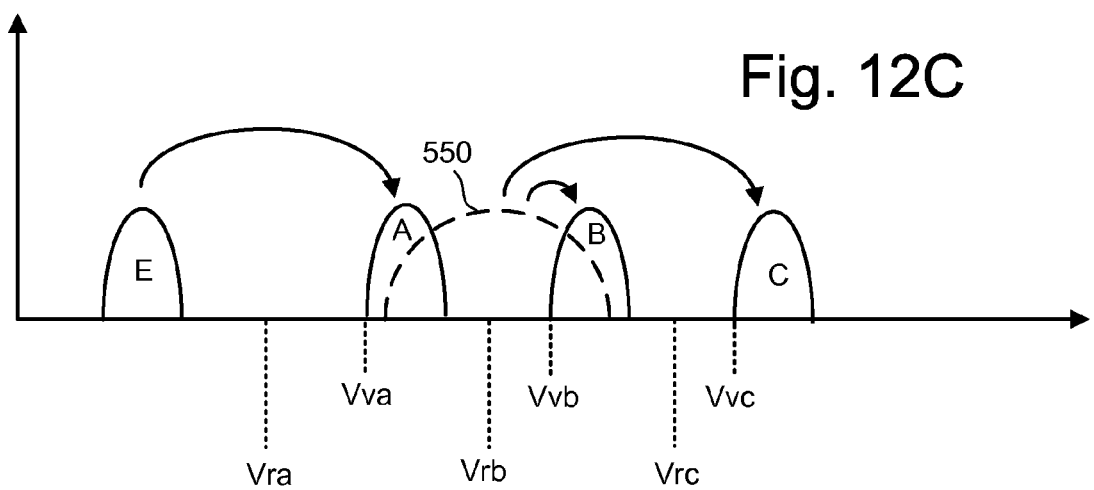

FIGS. 12A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 12A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIGS. 12A-C, the upper page stores bit 0 and the lower page stores bit 1. With reference to state B, the upper page stores bit 1 and the lower page stores bit 0. With reference to state C, both pages store bit data 0.

The programming process of FIGS. 12A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 12A therefore shows the programming of memory cells from state E to state B'. State B' depicted in FIG. 12A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, after the lower page for a memory cell connected to WL0 is programmed, the lower page for a memory cell (the neighbor memory cell) on the same NAND string but connected to WL1 would be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted in FIG. 12B. This apparent widening of the threshold voltage distribution will be remedied when programming the upper page.

FIG. 12C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 12A-C reduces the effect of coupling between floating gates because only the upper page programming of neighbor memory cells will have an effect on the apparent threshold voltage of a given memory cell.

Although FIGS. 12A-C provide an example with respect to four data states and two pages of data, the concepts taught by FIGS. 12A-C can be applied to other implementations with more or less than four states, different than two pages, and/or other data encodings.

FIG. 13 is a table that describes one embodiment of the order for programming memory cells utilizing the programming method of FIGS. 12A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

In some embodiments, data is programmed to memory cells along a common word line. Thus, prior to applying the program pulses, one of the word lines is selected for programming. This word line will be referred to as the selected word line. The remaining word lines of a block are referred to as the unselected word lines. The selected word line may have one or two neighboring word lines. If the selected word line has two neighboring word lines, then the neighboring word line on the drain side is referred to as the drain side neighboring word line and the neighboring word line on the source side is referred to as the source side neighboring word line. For example, if WL2 is the selected word line, then WL1 is the source side neighboring word line and WL3 is the drain side neighboring word line. In some embodiment, a block of memory cells are programmed from the source to the drain side. For example, memory cells connected to WL0 are programmed first, followed by programming memory cells on WL1, followed by programming memory cells on WL2, etc. As described above, FIG. 13 described a slight variation on this order that still generally programs from the source side to the drain side.

Figure 14:
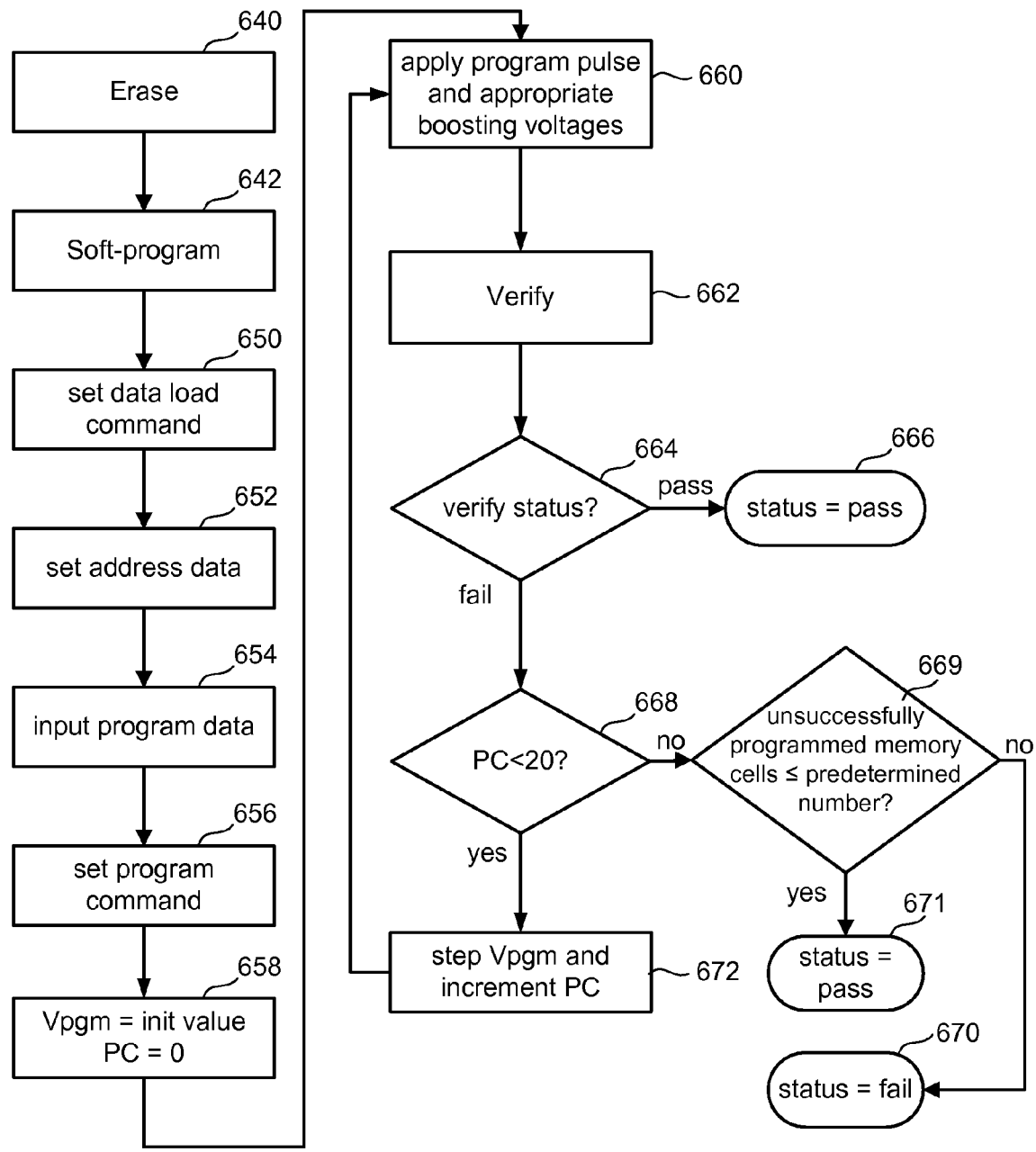
FIG. 14 is a flow chart describing one embodiment of a process for programming non-volatile memory.

FIG. 14 is a flow chart describing a programming process for programming memory cells connected to a selected word line. Thus, the process of FIG. 14 is used to implement the full sequence programming of FIG. 10, one pass (either the first pass or the second pass) of the two pass programming technique of FIG. 11, or one pass (either the first pass or the second pass) of the two step programming technique of FIGS. 12A-C and 13. Because a programming process may include programming multiple pages, the programming process may include performing the process of FIG. 14 multiple times.

In one implementation of the process of FIG. 14, memory cells are erased (in blocks or other units) prior to programming (step 640). Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, separate blocks, or another unit of cells. After the block of memory cells is erased, the various memory cells can be programmed or partially programmed as described herein. Note that the erasing that is performed in step 640 would not need to be performed before each word line of a block is programmed. Rather, the block can be erased and then each word line can be programmed without erasing between the programming of the word lines.

At step 642, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 650, a "data load" command is issued by controller 450 and input to state machine 412. At step 652, address data designating the page address is provided to the decoder. At step 654, a page of program data for the addressed page is input for programming. For example, 528 bytes of data could be input in one embodiment. That data is latched in the appropriate registers/latches for the selected bit lines. In some embodiments, the data is also latched in a second register for the selected bit lines to be used for verify operations. At step 656, a "program" command is received from controller 450 and provided to state machine 412.

Triggered by the "program" command, the data latched in step 654 will be programmed into the selected memory cells controlled by state machine 412 using the pulses applied to the appropriate word line. At step 658, Vpgm, the programming voltage signal (e.g., a series of pulses) is initialized to the starting magnitude (e.g., ~12V or another suitable level) and a program counter PC maintained by state machine 412 is initialized at 0. At step 660, a pulse of the program signal Vpgm is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to $V_{DD}$ to inhibit programming.

At step 662, the states of the selected memory cells are verified using the appropriate set of target levels, as discussed above. If it is detected that the threshold voltage of a selected cell has reached the appropriate target level, then the data stored in the corresponding data latch is changed to a logic "1." If it is detected that the threshold voltage has not reached the appropriate target level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 664, it is checked whether all of the data latches are storing logic "1." If so, the programming process is complete and successful because all selected memory cells were programmed and verified to their target states. A status of "PASS" is reported at step 666. Note that in some implementations, at step 664 it is checked whether at least a predetermined number of data latches are storing a logic "1." This predetermined number can be less than the number of all data latches, thereby allowing the programming process to stop before all memory cells have reached their appropriate verify levels. The memory cells that are not successfully programmed can be corrected using error correction during the read process.

If, at step 664, it is determined that not all of the data latches are storing logic "1," then the programming process continues. At step 668, the program counter PC is checked against a program limit value. One example of a program limit value is 20; however, other values can be used in various implementations. If the program counter PC is not less than the program limit value, then it is determined at step 669 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 671. In many cases, the memory cells that are not successfully programmed can be corrected using error correction during the read process. If however, the number of unsuccessfully programmed memory cells is greater than the predetermined number, the program process is flagged as failed and a status of FAIL is reported at step 670. If the program counter PC is less than the program limit value (e.g., 20), then the magnitude of the Vpgm pulse is increased by the step size (e.g., 0.2-0.4 volt step size) and the program counter PC is incremented at step 672. After step 672, the process loops back to step 660 to apply the next Vpgm pulse.

In general, during verify operations (such as the verify operations performed during step 662 of FIG. 14) and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

It has been observed that the margin for program disturb on the selected word line, particular for WL0 (the word line at the end of the NAND string, with respect to the other word lines, and first to be programmed) next to the source side select gate, depends on the state of the neighboring memory cell. If the neighboring memory cell is in the erased state, the channel area under that neighboring memory cell should be in a conducting state during the boosting process (during program inhibit). However, if that neighbor memory cell is partially programmed (e.g. in the intermediate state 550, depicted as B' in FIGS. 12A-C, or another state that is not the intended final programmed state), then the channel area under that neighboring memory cell can become in the cut-off state or conduct less than if it were not partially programmed. In this latter case, the channel area under the inhibited memory cell connected to the selected word line will be boosted different than intended and may be not boosted sufficiently to avoid program disturb. As a result, the optimum value for Vpass to appropriately reduce program disturb depends on the state of the neighbor memory cell. To remove this data dependence, it is proposed that a higher boosting voltage be applied to the neighbor memory cell than is applied to the other unselected memory cells. As a result, the channel area under the neighbor memory cell will be in its appropriate conducting state independent of the data that is stored in the neighbor memory cell.

Figure 15:
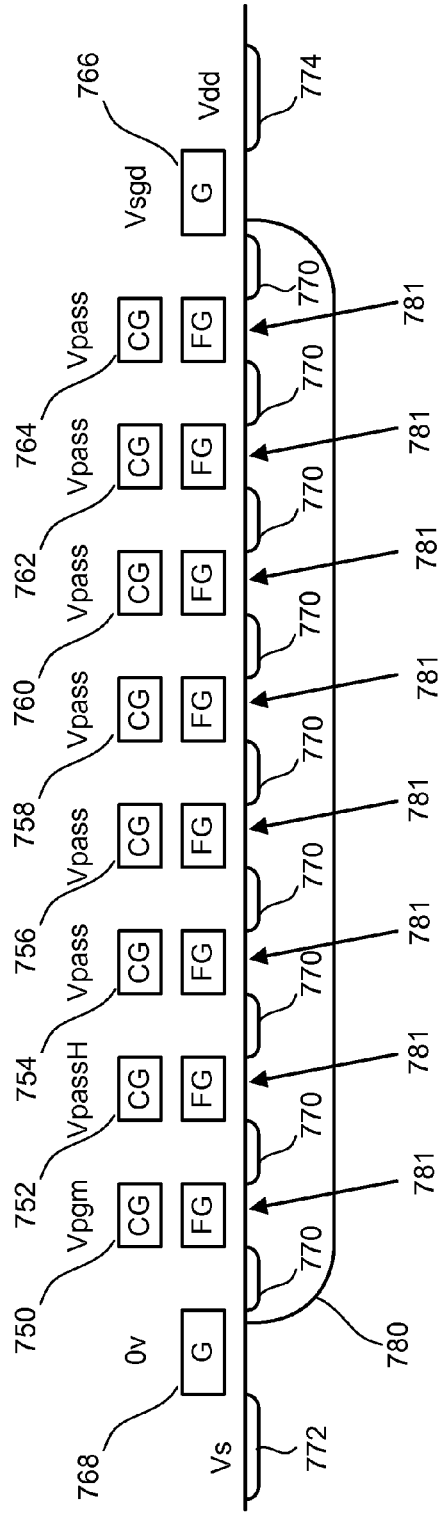
FIG. 15 depicts a NAND string and a set of voltages applied to the NAND string during a programming operation.

FIG. 15 depicts a NAND string, that is to be inhibited from programming during an iteration of step 660 of FIG. 14, biased as proposed with the higher boosting voltage is applied to the neighbor memory cell. As a result of the voltages applied as depicted in FIG. 15, at least a portion (if not all) of the NAND string is boosted so that programming is inhibited. The NAND string of FIG. 15 includes eight memory cells 750, 752, 754, 756, 758, 760, 762, and 764. Memory cells 750 and 764 are at the ends of the NAND string, with respect to the other memory cells. Each of those eight memory cells includes a floating gate (FG) and a control gate (CG). Between each of the floating gates are source/drain regions 770. In some implementations, there is a P-type substrate (e.g., Silicon), an N-well within the substrate and a P-well within the N-well (all of which are not depicted to make the drawings more readable). Note that the P-well may contain a so called channel implantation that is usually a P-type implantation that determines or helps to determine the threshold voltage and other characteristics of the memory cells. The source/drain regions 770 are N+ diffusion regions that are formed in the P-well.

At one end of the NAND string is a drain side select gate 766. The drain select gate 766 connects the NAND string to the corresponding bit line via bit line contact 774. At another end of the NAND string is a source select gate 768. Source select gate 768 connects the NAND string to common source line 772. During programming, the memory cell connected to the selected word line (e.g., memory cell 750) receives the program voltage Vpgm at its control gate via the selected word line. The boosting voltage Vpass of approximately 8-9 volts is applied to the control gates of the memory cells that are not selected for programming (e.g., memory cells 754, 756, 758, 760, 762, and 764), except for the neighbor memory cell. A higher boosting voltage VpassH is provided to the control gate of the neighbor memory cell 752 via word line WL1. VpassH is a higher voltage than Vpass. In one embodiment, VpassH is 1-4 volts higher than Vpass, or another differential can be employed as appropriate for the particular embodiment. In one implementation, VpassH is higher than Vpass by an amount equal to the differential between state E and state B' (see FIG. 12B). Note that making VpassH too high could cause program disturb on the memory cells receiving VpassH.

Neighbor memory cell 752 may be partially programmed or may not, depending on the data to be stored. For example, if the data to be stored is a "1," then the memory cell will still be in the erased state E. If the data to be stored is a "0," then the memory cell may have been moved to intermediate state B' (threshold voltage 550 of FIGS. 12A-C).

Source select gate 768 is in an isolating state, receiving 0 volts at its gate (G). A low voltage is applied to the common source line 772. This low voltage can be zero volts. However, the source voltage can also be slightly higher than zero volts to provide better isolation characteristics of the source side select gate. A voltage Vsgd, which is typically in the range of the power supply voltage Vdd (e.g., 2.5 volts), is applied to drain side select gate 766. Vdd is applied to bit line contact 774 via the corresponding bit line to inhibit programming of the selected memory cell 750. As a result of the boosting voltages, the channel area of the NAND string is boosted (as described above). Because the voltage differential between the floating gate of memory cell 750 and the channel has been reduced, programming is inhibited. FIG. 15 shows region 780, which includes the boosted channel area 781 located at the surface of the substrate (between source/drain regions 770 and below the floating gate/control gate stacks) and a depletion layer (an area with increased electrical field due to the channel that is boosted to a high voltage) under the boosted channel area.

Figure 16:
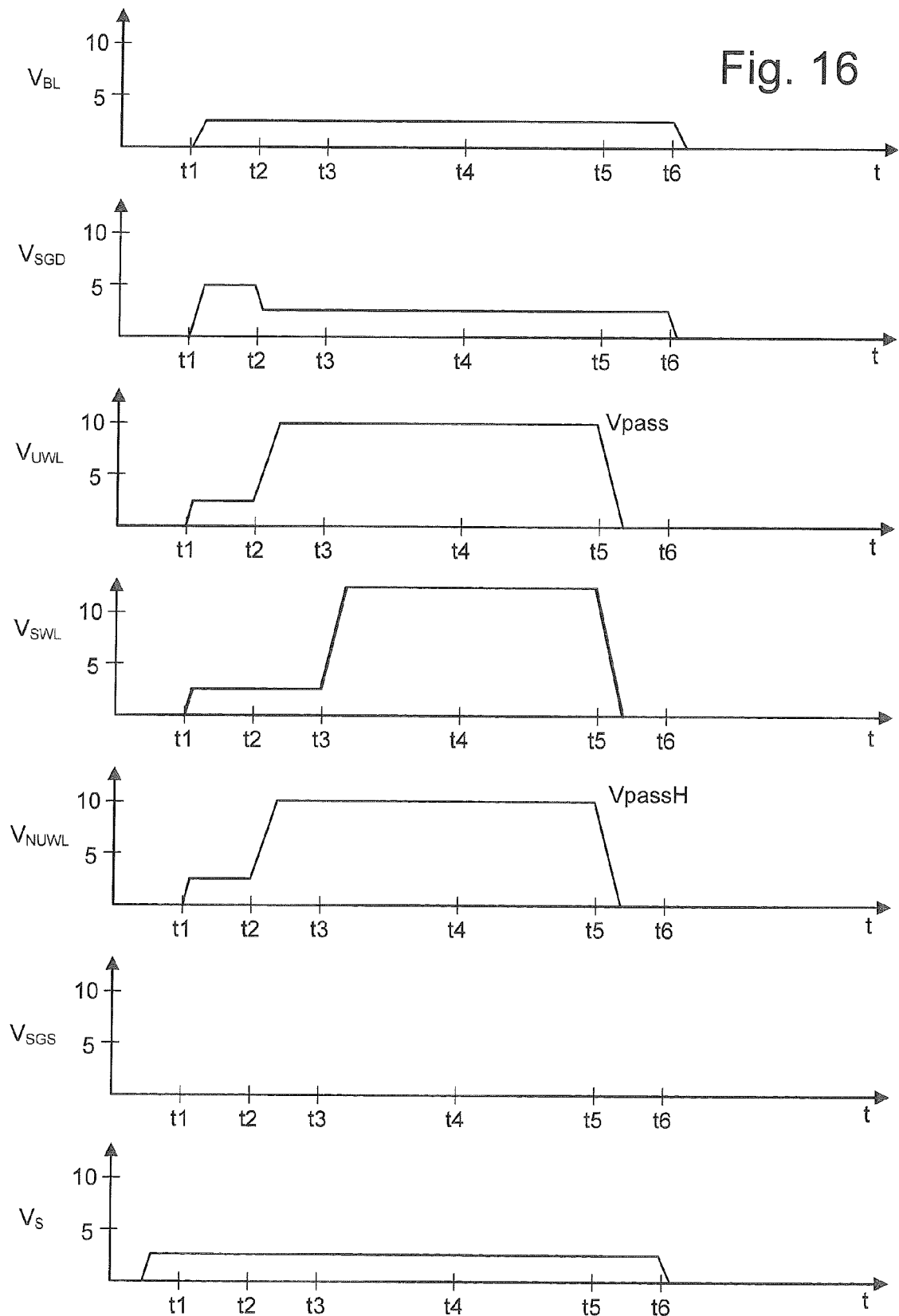
FIG. 16 is a timing diagram that explains the behavior of certain signals during a programming operations.

FIG. 16 is a timing diagram describing one example of the timing for applying the various signal depicted in FIG. 15 for an unselected NAND string for one iteration of step 660 of FIG. 14. FIG. 16 shows the bit line voltage $V_{BL}$ being at Vdd (e.g., 2.5 volts) from t2 to t6, which inhibits the NAND string associated with that particular bit line. The select gate voltage $V_{SGD}$ (the voltage at the control gate of the select transistor SGD) is raised to 5 volts at t1 and then lowered to 2.5 volts (e.g. Vdd) at t2, where it remains until t6. The period when $V_{SGD}$ is at 5 volts, between t1 and t2, is optionally used to increase the pre-charge voltage level of the NAND string. The voltage on the unselected word lines $V_{UWL}$ is raised to Vdd at t1 to allow pre-charging and then is raised to approximately Vpass at t2 to boost the NAND string associated with the unselected bit lines. The pass voltage of Vpass will remain on the unselected word lines until approximately t5. Note that in the embodiment of FIG. 15, $V_{UWL}$ is applied to all of the word lines except the neighbor word line. The voltage $V_{NUWL}$ on the unselected neighbor word line, which in FIG. 15 is WL1 (corresponding to memory cell 752), is raised to Vdd at t1 to allow pre-charging and then is raised to approximately VpassH at t2 to help boost the NAND string associated with the unselected bit lines. The pass voltage of VpassH will remain on the unselected neighbor word lines until approximately t5. The voltage $V_{SWL}$ on the selected word line (e.g. WL0 in FIG. 15, corresponding to memory cell 750) is raised to Vdd at t1 to allow pre-charging. At t3, the programming pulse is applied until t5. In one example, the programming pulses can range between 12 volts and 20 volts. Note that the control gate of the source side select gate ($V_{SGS}$) is at 0 volts throughout and the source voltage $V_S$ is raised to Vdd at prior to t1 and remains there until t6. Note that the exact timing of the various signals described above can be varied as per the particular implementation. Note that FIG. 15 corresponds to the state of the voltage signals at time t4 of FIG. 16. In some implementations, Vuwl, Vswl and Vnuwl are connected to Vdd (or another voltage >0V) during t1-t2. In other implementations, Vuwl, Vswl and Vnuwl are at 0V during interval t1-t2.

Figure 17:
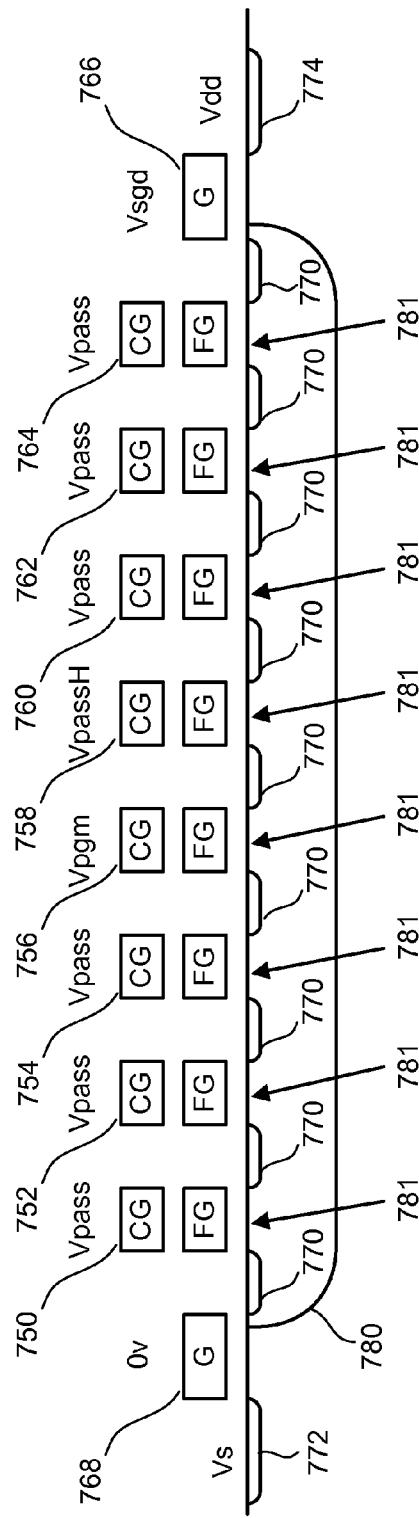
FIG. 17 depicts a NAND string and a set of voltages applied to the NAND string during a programming operation.

FIGS. 15 and 16 pertain to the case where a higher boosting voltage is used for an unselected neighbor word line when WL0 is selected. However, the technology described herein also pertains to situations when other word lines are selected for programming. For example, FIG. 17 show the NAND string being inhibited from programming when the word line (e.g., WL3) connected to memory cell 756 is selected. In this case, the word line (e.g. WL4) next to the selected word line will receive the higher pass voltage VpassH. More specifically, FIG. 17 shows targeted but unselected memory cell 756 receiving Vpgm. Neighbor memory cell 758 receives VpassH. Memory cells 750, 752, 754, 760, 762 and 764 receive Vpass. As a result of applying the boosting voltages, channel area 781 at the surface of region 780 is boosted and memory cell 756 is properly inhibited from programming. The timing of the signal depicted in FIG. 17 is analogous to that of FIG. 16. FIG. 17 only shows one example, and the application of VpassH to the neighbor can be used when other word lines are selected for programming.

Note that in some alternatives, the memory cells on the source side of the memory cell receiving the program voltage can receive a pass voltage that is higher than Vpass. For example, memory cells 750, 752 and/or 754 can receive Vpass, VpassH or VpassO, where VpassO can be higher, lower or similar to VpassH or Vpass.

FIG. 15 shows memory cells 754, 756, 758, 760, 762, and 764 all receiving the same signal Vpass. Similarly, FIG. 17 shows memory cells 750, 752, 754, 760, 762 and 764 all receiving the same signal Vpass. However, in some embodiments these memory cells need not receive the same exact voltage as each other. For example, the voltages may vary by word line, as long as they (or a subset) are less than VpassH.

Both FIG. 15 and FIG. 17 depict the use of the proposed technology to modify the self-boosting scheme described above. However, the proposed technology can also be used to modify other boosting schemes.

FIG. 18 depicts the NAND string when a word line other than WL0 is selected for programming and the proposed technology is used to modify the EASB boosting scheme. Targeted, but unselected, memory cell 756 receives Vpgm. Neighbor memory cell 758 receives VpassH. Memory cells 750, 752, 760, 762 and 764 receive Vpass. Memory cell 754 receives the isolation voltage (e.g., 0 volts). As a result of applying the boosting voltages, a highly boosted channel area and a lower boosted channel area are created. For example, FIG. 18 depicts region 782 that includes the highly boosted channel area 783 located at the surface of the substrate and a depletion layer under the higher boosted channel area. FIG. 18 also shows region 784 that includes the lower boosted channel area 785 located at the surface of the substrate and a depletion layer under the lower boosted channel area. The highly boosted channel area causes memory cell 756 to be properly inhibited from programming. The timing of the signal depicted in FIG. 18 is analogous to that of FIG. 16. FIG. 18 only shows one example, and the application of VpassH to the neighbor can be used when other word lines are selected for programming. Note that if WL0 is selected for programming, the proposed technology is applied to the EASB boosting scheme will match the scheme depicted in FIG. 15, since the difference between self-boosting and EASB is based on the source side and there is no source side when WL0 is selected for programming.

FIG. 19 depicts the NAND string when a word line other than WL0 is selected for programming and the proposed technology is used to modify the REASB boosting scheme. Targeted, but unselected, memory cell 756 receives Vpgm. Neighbor memory cell 758 receives VpassH. Memory cells 750, 760, 762 and 764 receive Vpass. Memory cell 752 receives the isolation voltage (e.g., 0 volts). Memory cell 754 receives the intermediate voltage Vgp (e.g., 2-5 volts) via its connected word line. As a result of applying the boosting voltages, a highly boosted channel area and a lower boosted channel area are created. For example, FIG. 19 depicts region 788 that includes the highly boosted channel area 789 located at the surface of the substrate and a depletion layer under the higher boosted channel area. FIG. 19 also shows region 790 that includes the lower boosted channel area 791 located at the surface of the substrate and a depletion layer under the lower boosted channel area. The highly boosted channel area causes memory cell 756 to be properly inhibited from programming. The timing of the signal depicted in FIG. 19 is analogous to that of FIG. 16, with Vgp having similar timing to Vpass. FIG. 19 only shows one example, and the application of VpassH to the neighbor can be used when other word lines are selected for programming. Note that if WL0 is selected for programming, the proposed technology applied to the REASB boosting scheme will match the scheme depicted in FIG. 15, since the difference between self-boosting and EASB is based on the source side and there is no source side when WL0 is selected for programming.

Figure 20:
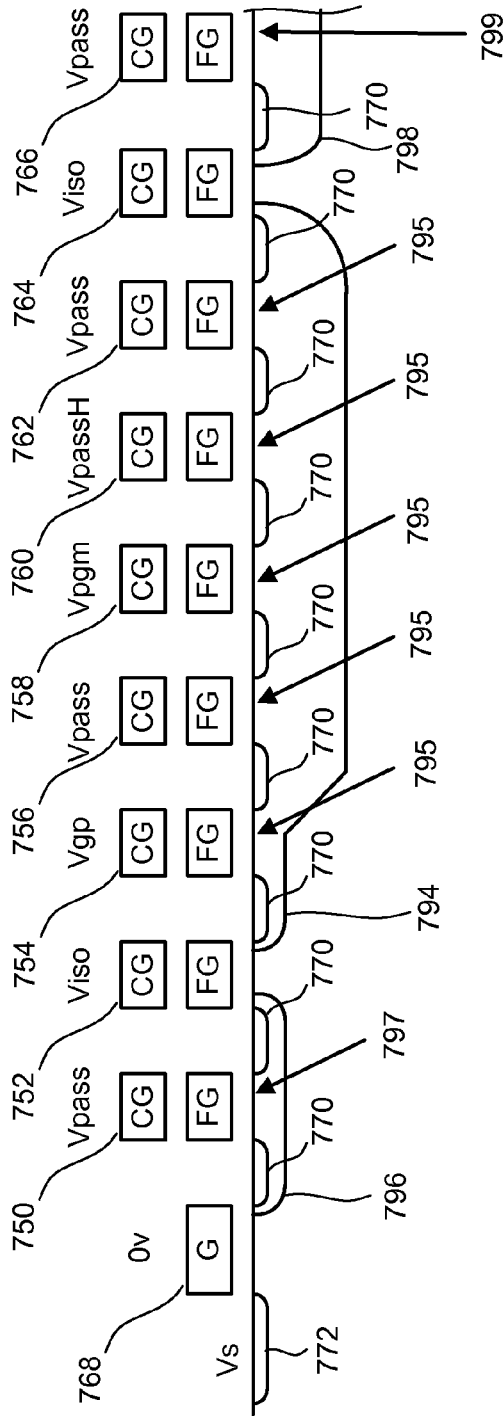
FIG. 20 depicts a NAND string and a set of voltages applied to the NAND string during a programming operation.

FIG. 20 depicts the NAND string when a word line other than WL0 is selected for programming and the proposed technology is used to modify an alternative boosting scheme. Targeted, but unselected, memory cell 758 receives Vpgm. Neighbor memory cell 760 receives VpassH. Memory cells 750, 756, 760, 762, 766, . . . receive Vpass. As discussed above, the technology described herein can be used with NAND strings longer than eight memory cells. FIG. 20 shows a portion of a NAND string having more than eight memory cells. Memory cells 752 and 764 receive the isolation voltage via their connected word lines. Memory cell 754 receives the intermediate voltage Vgp via its connected word line. As a result of applying the boosting voltages, a highly boosted channel area, a medium boosted channel area and a lower boosted channel area are created. For example, FIG. 20 depicts region 794 that includes the highly boosted channel area 795 located at the surface of the substrate and a depletion layer under the higher boosted channel area; region 798 that includes the medium boosted channel area 799 located at the surface of the substrate and a depletion layer under the lower boosted channel area; and region 796 that includes the lower boosted channel area 797 located at the surface of the substrate and a depletion layer under the lower boosted channel area. The highly boosted channel area causes memory cell 758 to be properly inhibited from programming. The timing of the signal depicted in FIG. 20 is analogous to that of FIG. 16, with Vgp having similar timing to Vpass. FIG. 20 only shows one example, and the application of VpassH to the neighbor can be used when other word lines are selected for programming.

In some embodiments, the system may partially program more than one memory cell of a NAND string prior to completing the programming of a currently selected memory cell. For example, the programming process of FIGS. 12A-C can be modified to perform the first pass/step for three word lines before going back to complete programming on the first word line. In one example that stores three pages of data in a memory cell, data can be written in the following order: (1) lower page data is written in WLn, (2) lower page data is written in WLn+1, (3) middle page data is written in WLn, (4) lower page data is written in WLn+2, (5) middle page data is written in WLn+1, and (6) upper page data is written in WLn to finish writing all 3 pages in WLn. Other methods/schemes can also be used. In these examples, there are two word lines that have possibly (depending on the data to be stored) been subjected to partial programmed and can receive VpassH during the programming of the first word line.

Figure 21:
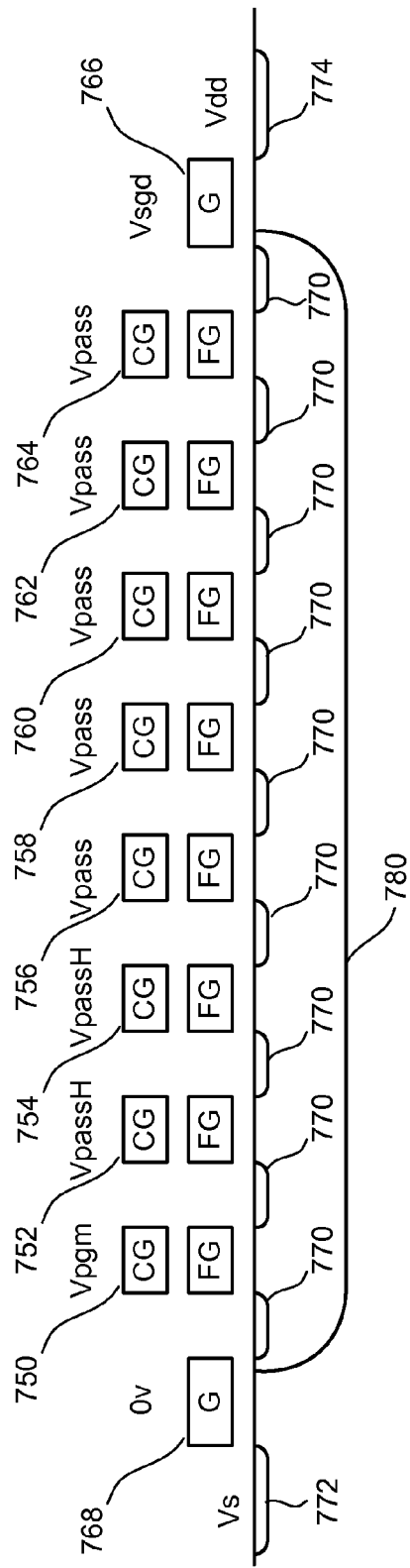
FIG. 21 depicts a NAND string and a set of voltages applied to the NAND string during a read operation.

FIG. 21 shows an example where two word lines receive VpassH. More specifically, memory cell 750 connected to the selected word line (e.g., WL0) receives the program voltage Vpgm at its control gate via the selected word line. The boosting voltage Vpass is applied to the control gates of the unselected memory cells 756, 758, 760, 762, and 764. The higher boosting voltage VpassH is provided to the control gate of memory cell 752 via word line WL1 and memory cell 754 via word line WL2. Note that although FIG. 21 shows two memory cells receiving VpassH because those two memory cells may or may not be partially programmed since the last erase process for the NAND string, other embodiments can include more than two memory cells receiving VpassH because those memory cells may or may not be partially programmed since the last erase process for the NAND string.

Note that in embodiments where more than one word line receives the higher boosting voltages, they need not all receive the exact same VpassH. The word lines receiving the higher boosting voltages may receive different variations of VpassH. In one embodiment, each of the variations of VpassH are greater than Vpass.

Consider an example when a block of memory cells are programmed using the process of FIGS. 12A-C. According to the chart of FIG. 13, the memory cells connected to WL0 will be partially programmed (see FIG. 12A) so that their lower pages have data. Subsequently, the memory cells connected to WL1 will be partially programmed (see FIG. 12A) so that their lower pages have data. At this point the memory cells connected to WL0 and WL1 have not completed full programming since the block was erased (see step 640 of FIG. 14). Subsequently, the memory cells connected to WL0 will complete their programming (see FIG. 12C) so that their upper pages also have data. When completing the programming for WL0 (e.g., programming the upper page), the various word lines of the NAND strings will be biased as depicted in FIG. 15. These concepts can be extended to other word lines, as per FIGS. 16-20. Additionally, the various word lines of the NAND strings can be biased as depicted in FIG. 15 when programming the lower page.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method performed during programming of non-volatile storage, comprising:
   boosting a group of connected non-volatile storage elements, the group of connected non-volatile storage elements includes a particular non-volatile storage element, the boosting includes:
      applying a first boosting signal to one or more non-volatile storage elements of the group that have started but not completed full programming since a last erase process for the group, the one or more non-volatile storage elements include a first neighbor non-volatile storage element, the first neighbor non-volatile storage element is next to and on a first side of the particular non-volatile storage element, and
      applying a second boosting signal to a plurality of other non-volatile storage elements of the group that have or not started programming since the last erase process for the group, the first boosting signal is greater in voltage than the second boosting signal by at least a voltage offset based on the difference between an erased state and an intermediate programmed state of the first neighbor non-volatile storage element; and
   applying a program signal to the particular non-volatile storage element while the group is boosted such that the particular non-volatile storage element is not programmed in response to the program signal.

2. The method of claim 1, wherein
the boosting of the group of connected non-volatile storage elements includes applying the first boosting signal to an additional non-volatile storage element of the group which has started but not completed full programming since the last erase process for the group, the additional non-volatile storage element is next to the first neighbor non-volatile storage element.

3. The method of claim 1, wherein
the first neighbor non-volatile storage element is on a drain side of the particular non-volatile storage element.

4. The method of claim 1, wherein
the group of connected non-volatile storage elements comprises a NAND string.

5. The method of claim 1, wherein
the group of connected non-volatile storage elements comprises multi-state non-volatile storage devices.

6. A method performed during programming of non-volatile storage, comprising:
   boosting a group of non-volatile storage elements, the group of non-volatile storage elements includes a particular non-volatile storage element, the boosting includes:
      applying one or more boosting signals to one or more non-volatile storage elements of the group that have started but not completed full programming since a last erase process for the group, the one or more non-volatile storage elements include a first neighbor non-volatile storage element, the first neighbor non-volatile storage element is next to and on a first side of the particular non-volatile storage element, and
      applying one or more different boosting signals to a plurality of non-volatile storage elements of the group that have not started programming since the last erase process for the group, the one or more boosting signals are higher in voltage than the one or more different boosting signals by at least a voltage offset based on the difference between an erased state and an intermediate programmed state of the first neighbor non-volatile storage element; and
   applying a program signal to the particular non-volatile storage element of the group while the group is boosted such that the particular non-volatile storage element is not programmed in response to the program signal.

7. The method of claim 6, wherein
the non-volatile storage elements of the group that have started but not completed full programming since the last erase process for the group include a first non-volatile storage element next to and on a first side of the particular non-volatile storage element and a second non-volatile storage element next to the first non-volatile storage element.

8. The method of claim 6, wherein
the non-volatile storage elements of the group that have started but not completed full programming since the last erase process for the group include a first non-volatile storage element next to and on a first side of the particular non-volatile storage element and a second non-volatile storage element next to the first non-volatile storage element, the first side is associated with a drain side of the particular non-volatile storage element.

9. The method of claim 6, wherein
the non-volatile storage elements of the group that have started but not completed full programming since the last erase process for the group include a first non-volatile storage element next to and on a first side of the particular non-volatile storage element; and the plurality of non-volatile storage elements includes all non-volatile storage elements of the group that have not started programming since the last erase process for the group.

10. A method performed during programming of non-volatile storage, the non-volatile storage includes a plurality of non-volatile storage elements, the method comprising:

partially programming non-volatile storage elements connected to a first control line of a plurality of control lines, the non-volatile storage elements connected to the first control line are part of the plurality of non-volatile storage elements;

partially programming non-volatile storage elements connected to a second control line of the plurality of control lines after partially programming non-volatile storage elements connected to the first control line, the non-volatile storage elements connected to the second control line are part of the plurality of non-volatile storage elements; and completing programming of non-volatile storage elements connected to the first control line after partially programming non-volatile storage elements connected to the second control line, the completing programming comprises applying a first boosting signal to the second control line, applying one or more different boosting signals to a plurality of other control lines that have not yet received a programming signal since the last erase process for the plurality of non-volatile storage elements, the first boosting signal is higher in voltage than the one or more different boosting signals by at least a voltage offset based on the difference between an erased state and an intermediate programmed state associated with the non-volatile storage elements connected to the second control line, and applying a program signal to the first control line in order to complete the programming of appropriate non-volatile storage elements connected to the first control line without disturbing non-volatile storage elements connected to the first control line that are not supposed to be programmed.

11. The method of claim 10, wherein the control lines that are connected to non-volatile storage elements that have completed programming since the last erase process for the plurality of non-volatile storage elements include a third control line that is next to the first control line; and the second control line is next to the first control line and on a different side of the first control line than the third control line.

12. The method of claim 10, wherein
the plurality of control lines are word lines.

13. The method of claim 10, wherein
the applying of one or more different boosting signals includes applying a common signal to all control lines that have not yet received a programming signal since the last erase process for the plurality of non-volatile storage elements; and the common signal is lower in voltage than the first boosting signal.

14. The method of claim 6, wherein
the one or more non-volatile storage elements of the group and the plurality of one or more non-volatile storage elements of the group are on the same side of the particular non-volatile storage element of the group.

15. The method of claim 10, wherein
the second control line is next to the first control line and on a first side of the first control line; and the other control lines that have not yet received a programming signal since the last erase process for the plurality of non-volatile storage elements includes control lines on the first side of the first control line.

16. The method of claim 11, wherein
the other control lines that have not yet received a programming signal since the last erase process for the plurality of non-volatile storage elements includes control lines on the same side of the first control line as the second control line.

* * * * *